US006388482B1

(12) United States Patent
Schnell et al.

(10) Patent No.: US 6,388,482 B1
(45) Date of Patent: May 14, 2002

(54) DLL LOCK SCHEME WITH MULTIPLE PHASE DETECTION

(75) Inventors: Josef Schnell; Oliver Kiehl, both of Charlotte, VT (US)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/598,350

(22) Filed: Jun. 21, 2000

(51) Int. Cl.[7] ................................................. H03L 7/06
(52) U.S. Cl. ........................................ 327/158; 327/161
(58) Field of Search ................................ 327/158, 161, 327/263, 269, 271; 331/25, 11, 1 R; 375/226, 373, 375

(56) References Cited

U.S. PATENT DOCUMENTS

| | | | |
|---|---|---|---|
| 4,121,159 A | | 10/1978 | Lampert ..................... 375/358 |
| 5,706,057 A | * | 1/1998 | Strolle et al. ................ 375/326 |
| 5,744,991 A | * | 4/1998 | Jefferson et al ............. 327/158 |
| 5,856,762 A | | 1/1999 | Werker et al. ............... 327/156 |
| 5,889,424 A | | 3/1999 | Iwata et al. .................. 327/355 |
| 5,903,144 A | | 5/1999 | Kramer ................... 324/76.63 |
| 6,043,694 A | | 3/2000 | Dortu .......................... 327/159 |
| 6,125,157 A | * | 9/2000 | Donnelly et al. ........... 327/141 |
| 6,157,690 A | * | 12/2000 | Yoneda ....................... 375/376 |

* cited by examiner

Primary Examiner—Timothy P. Callahan
Assistant Examiner—Linh Nguyen

(57) ABSTRACT

A delay lock loop, in accordance with the present invention, includes a plurality of phase detectors each receiving a first clock signal and a second clock signal. Each phase detector includes a specified delay range for detecting phase differences between the first and second clock signals in that range. A delay line includes an input and an output. The first clock signal is received at the input, and the second clock signal includes a delayed first clock signal. An amount of delay is applied to the first clock signal, which is adjusted in the delay line in accordance with control signals of the phase detectors.

29 Claims, 4 Drawing Sheets

| Cases: | PD-8 | PD-4 | PD-2 | +2 | PD+4 | PD+8 | # steps Conventional scheme |
|---|---|---|---|---|---|---|---|
| 1 | + | + | | + | + | + | 9 |
|   | - | - | | + | + | + | |
|   | - | - | | 0 | + | + | |
| 2a | - | + | | + | + | + | 7 |
|   | - | - | | + | + | + | |
|   | - | - | | + | + | + | |
|   | - | - | | + | + | + | |
|   | - | - | | 0 | + | + | |
| 2b | - | + | | + | + | + | 9 |
|   | - | - | | + | + | + | |
|   | - | - | | + | + | + | |
|   | - | - | | + | + | + | |
|   | - | - | | + | + | + | |
|   | - | - | | 0 | + | + | |
| 2c | - | + | | + | + | + | 5 |
|   | - | - | | + | + | + | |
|   | - | - | | 0 | + | + | |
| 3 | - | - | | - | - | - | 9 |
|   | - | - | | - | + | + | |
|   | - | - | | 0 | + | + | |

FIG. 5

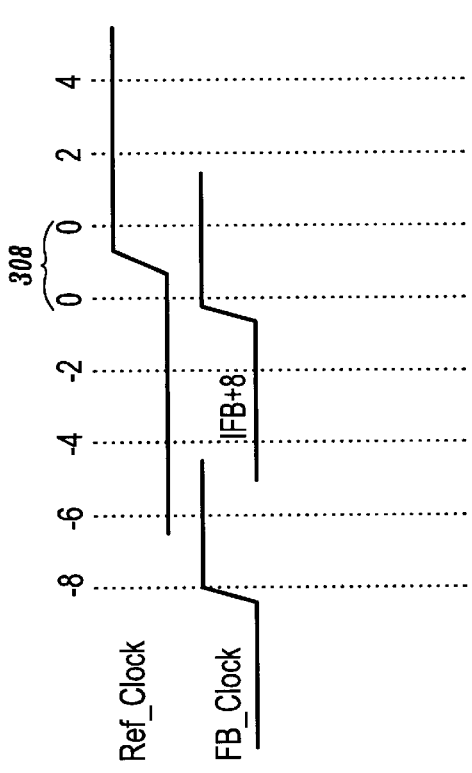
FIG. 7
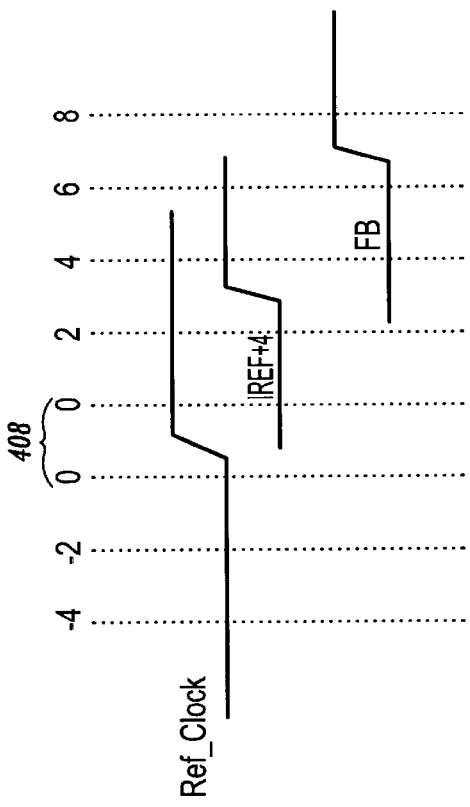
FIG. 9
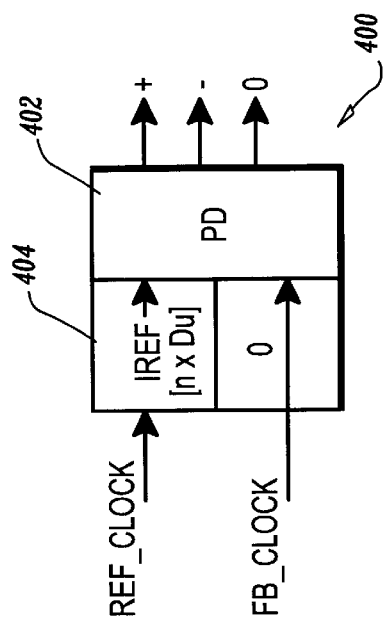
FIG. 6
FIG. 8

DLL LOCK SCHEME WITH MULTIPLE PHASE DETECTION

BACKGROUND

1. Technical Field

This disclosure relates to semiconductor devices and more particularly, to a fast delay locked loop with the capability of detecting multiple phase differences between a clock signal and a delayed clock signal.

2. Description of the Related Art

Conventional double data rate (DDR) synchronous dynamic random access memories (SDRAM) employ a plurality of delay locked loop circuits (DLL). These DLL circuits are employed to synchronize delay between two signals, for example, a clock signal and a delayed clock signal.

Referring to FIG. 1, a delay lock loop 10 is shown. A clock receiver 11 receivers clock signals (CK/ and its complement bGK). Conventional DLL implementations usually have one phase detector (PD) circuit 12 to detect the phase difference between a reference clock (Ref_clock) and a feedback clock (FB_clock) for clock synchronization. Based on the phase difference, an output of phase detector 12 is +, − and 0 and controls a delay line (DL) control unit 14 to increment or decrement a delay line 16 by one delay unit (e.g., ~50 to ~100 ps depending on the design implementation). The increment/decrement of the DL line 16 is performed with every clock cycle or if a filter is implemented in the DL control unit 14, with every nth clock cycle.

If the Ref_clock and FB_clock are in phase the output of the PD 12 is 0 and the DLL 10 is locked. To maintain stable conditions while the DLL 10 is locked the PD 12 has a >PD offset= or a >timing dead zone= in the order of 1 times a delay unit or 2 times a delay unit.

Referring to FIG. 2, a timing relation of the FB_clock with the >PD offset= of one delay unit and the number of >+ and −' delay units to the reference Ref_clock is shown. The delay in FIG. 2 shows simple cases where a first FB_clock edge 20 can be approximately synchronized in 2 (+) delay units or a second FB_clock edge 22 can be approximately synchronized in 1 (−) delay unit. If a phase shift between the Ref_clock and FB_clock occurs due to noise and temperature variation on a chip the DLL needs a number, sometimes hundreds, of clock cycles to synchronize Ref_clock and FB_clock.

In DDR SDRAM=s DLL=s are required to synchronize the DQ (or output pin) to the system clock CK/bCK in a read operation. In a conventional DLL scheme, the DLL update is usually performed with every clock cycle and therefore requires all parts of the DLL to be active. As a result, in a power down mode, the DLL will be active and consume power. For power savings while in power down mode, the DLL can be automatically turned off and the state of the pointer settings (e.g., from the delay control unit) is "frozen". (Note: No DLL reset is performed in this operation).

Due to temperature and voltage variation on the chip, the pointer settings while entering the power down mode may not be accurate anymore after the power down mode exit. The temperature and voltage variation is usually caused by different modes of operations, e.g., read/write cycles, bank activate cycles or chip idle mode, and temperature and voltage variation affect the internal timing of the DLL and the pointer settings. Therefore, an immediate read cycle after power down mode exit may not be possible. Further, the synchronization of the system clock to the DQ=s (output pins of the chip) in a single read cycle may not be accurate, hence, compromising the necessary timing margins.

Therefore, a need exists for a delay lock loop (DLL) which provide greater margin is synchronizing signals, such that the signals are synchronized quickly and accurately to improve system performance.

SUMMARY OF THE INVENTION

A delay lock loop, in accordance with the present invention, includes a plurality of phase detectors each receiving a first clock signal and a second clock signal. Each phase detector includes a specified delay range for detecting phase differences between the first and second clock signals in that range. A delay line includes an input and an output. The first clock signal is received at the input, and the second clock signal includes a delayed first clock signal. An amount of delay is applied to the first clock signal, which is adjusted in the delay line in accordance with control signals of the phase detectors.

In alternate embodiments, the plurality of phase detectors may include five phase detectors. The specified ranges may include multiples of a delay unit. The delay lock loop may include a control unit coupled to the phase detectors for receiving the control signals and generating a delay line control signal which enables or disables delay elements in the delay line to adjust delay in the second clock signal. The delay lock loop may include an adjustment control circuit coupled to the phase detectors and the control unit, the adjustment control circuit being adapted to interpret the control signals from the phase detectors for the control unit to determine an adjustment size for a change in delay. The adjustment size may include at least two discrete sizes. The control signals may include one of an increment state, a decrement state and a lock state. The control signals of one of the phase detectors may be employed to determine when to increment, decrement or lock the delay of the second clock cycle. The phase detectors may include delay elements adapted to generate an internal clock signal to compare with one of the first clock signal and the second clock signal to determine a phase difference between the internal clock signal and one of the first clock signal and the second clock signal. The phase detector may output the control signal in accordance with the phase difference between the internal clock signal and one of the first clock signal and the second clock signal. Another delay lock loop in accordance with the present invention, includes a delay line including an input and an output. A first clock signal is received at the input, and a second clock signal includes a delayed first clock signal at the output. At least two phase detectors are provided. Each phase detector receives the first clock signal and the second clock signal. The phase detectors for determine a phase difference between the first clock signal and the second clock signal in a specified phase difference range and output a control signal in accordance with the phase difference. An adjustment circuit is coupled to outputs of the phase detectors for interpreting the control signals from the phase detectors. The adjustment circuit is adapted to determine whether to increment, decrement or lock the delay line and to determine a size of the increment or decrement to reduce the phase difference between the first and second clock signals.

In alternate embodiments, the at least two phase detectors may include five phase detectors. The specified phase difference ranges may include multiples of a delay unit. The adjustment circuit may provide a delay line control signal which enables or disables delay elements in the delay line to adjust delay in the second clock signal. The adjustment circuit may include an adjustment control circuit coupled to the phase detectors. The adjustment control circuit is adapted to interpret the control signals from the phase detectors for the control unit to determine an adjustment size for a change in delay. The adjustment size may include at least two discrete sizes. The control signals may include one of an increment state, a decrement state and a lock state. The control signals of one of the phase detectors is preferably employed to determine when to increment, decrement or lock the delay of the second clock cycle. The phase detectors may include delay elements adapted to generate an internal clock signal to compare with one of the first clock signal and the second clock signal to determine a phase difference between the internal clock signal and one of the first clock signal and the second clock signal. The phase detector may output the control signal in accordance with the phase difference between the internal clock signal and one of the first clock signal and the second clock signal.

A method for adjusting delay in a delay lock loop, in accordance with the present invention, includes the steps of providing a delay lock loop including a plurality of phase detectors, each receiving a first clock signal and a second clock signal. Each phase detector includes a specified delay range for detecting phase differences between the first and second clock signals in that range. A delay line includes an input and an output, and the first clock signal is received at the input and the second clock signal includes a delayed first clock signal. The method further includes the steps of determining phase differences for each phase detector, outputting control signals from the phase detectors, determining whether to increment, decrement or lock the delay lock loop, if an increment or decrement is determined, determining an amount of delay to be incremented or decremented by employing the control signals of all the phase detectors, and adjusting the delay line in accordance with the control signals. The method may further include the step of adjusting the delay of the second clock cycle by a plurality of delay units in a single clock cycle.

In other methods, the step of repeating the method steps until achieving a lock state is included. The specified phase difference ranges may include multiples of a delay unit. The amount of delay to be incremented or decremented may be adjusted by at least two discrete sizes. The control signals may include one of an increment state, a decrement state and a lock state. The control signals of one of the phase detectors is employed to determine when to increment, decrement or lock the delay of the second clock cycle.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein:

FIG. 5 is a table showing decoding outputs for cases 1, 2a–c and 3 employed to achieve the delay adjustments of FIG. 4 in accordance with the present invention;

FIG. 6 is a schematic diagram of a phase detector (PD−8) in accordance with the present invention;

FIG. 7 is a timing diagram showing the relevant clock signals employed in FIG. 6 for determining phase shifts in accordance with the present invention;

FIG. 8 is a schematic diagram of a phase detector (PD+4) in accordance with the present invention;

FIG. 9 is a timing diagram showing the relevant clock signals employed in FIG. 8 for determining phase shifts in accordance with the present invention.

DETAILED DESCRIPTION OF PREFERRED EMBODIMENTS

The present invention provides delay locked loop (DLL) circuits, which provide improved phase detection capabilities. A phase detection circuit of the present invention provides multiple phase detection modules which identify phase shifts between a reference clock cycle and a feedback cycle which extend over multiple increments (decrements). In addition, the multiple phase detection enables a fast DLL lock method with coarse and fine phase adjustments. By the present invention, DLL updates are, advantageously, enabled during an Auto Refresh (AR) cycle or any other specified operation, e.g., power down mode exit. For power reduction in a power down mode, the DLL delay path is disabled and pointer control (e.g., control unit) maintains its settings. After power down exit, the DLL of the present invention locks in after only a few cycles. This reduces waiting time after start up as compared to conventional systems. Advantageously, a fast DLL update, in accordance with the present invention, after initial power ON or Self Refresh exit, does not require many clock cycles after the DLL reset (e.g., less than 10 cycles).

Figure 3:
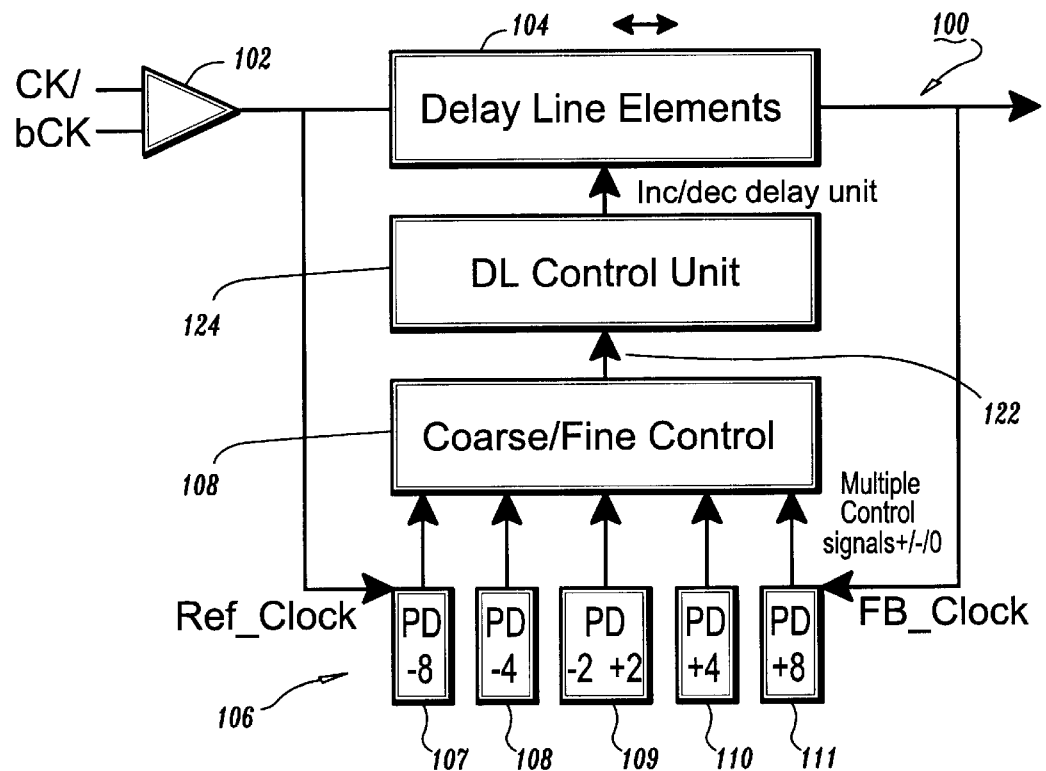
FIG. 3 is a schematic diagram showing a delay lock loop having multiple phase detectors in accordance with an illustrative embodiment of the present invention.

Referring now in specific detail to the drawings in which like reference numerals identify similar or identical elements throughout the several views, and initially to FIG. 3, a block diagram of a DLL 100 is illustratively shown for one embodiment of the present invention. DLL 100 includes a receiver 102, which receives a clock signal DK/ and it complement bCK. bCK includes the same magnitude but opposite polarity of CK/. Receiver 102 preferably includes a differential amplifier and converts clock pulses into digital signals. An output of receiver 102 is coupled to a delay line 104. Delay line 104 includes a plurality of elements, such as, for example, inverters, or RC circuits which provide a predetermined delay to clock signals input thereto (e.g., ~50 to ~100 ps depending on the design implementation). The increment/decrement of the DL line 104 may be performed with every clock cycle or if a filter is implemented in the DL control unit 124, with every nth clock cycle. The output of receiver 102 is also coupled to a phase detector 106.

Phase detector 106 includes multiple phase detector units 107–111, which provide multiple control signals for adjusting the phase detection between clock signals, reference clock (Ref_clock) and feedback clock (FB_clock). In the embodiment shown in FIG. 3, five phase detector (PD) units of circuits (107–111) are shown. Each PD unit (107–111) generates control signals, which are inputs to a coarse/fine control unit 108. The control signals generated by unit 107–111 preferably include +, − or 0 states. Each phase detector 107–111 has a different setting to detect different delay ranges between Ref_clock and FB_clock signals. Once the phase difference between the Ref_clock and the FB_clock signals is determined, an adjustment of the delay between the signals is performed by a coarse/fine control unit 108 and delay line 104.

In one example, units 107–111 include the following ranges: unit 107 includes a range of −8 delay units to 0, unit 108 includes a range of −4 delay units to 0, unit 109 includes a range of −2 delay unit to +2, unit 110 includes a range of 0 delay units to +4 and unit 111 includes a range of 0 to +8 delay units. All PD units 107–111 receive the same Ref_clock and the FB_clock signals. If the phase difference detected between the signals is to be incremented a '+' control signal is generated for the unit. In other words, the FB_clock signal need to be moved forward to be synchronized with the Ref_clock signal. Likewise, if the phase difference detected between the signals is to be decremented a '−' control signal is generated for the unit. If the signal is synchronized a 0 is generated and a lock state is achieved by DLL 100. Since all the PD units receive the same Ref_clock and the FB_clock signals an indication of how much delay should be added or subtracted for delay line 104 is provided.

Coarse/fine control circuit 108 detects whether delay in line 104 should be incremented or decremented in accordance with the control signals from PD units 107–111. In addition, information about how much adjustment is needed (e.g., coarse or fine, more levels are also contemplated) is supplied by evaluating the control signals of PD units 107–111. Coarse/fine control circuit 108 generates an output signal 122 to a delay line control unit 124, which may include a digital word, for example. Output signal 122 includes information about the size of the adjustment and the direction (increment or decrement) of the adjustment. Delay line control 124 controls delay line 104 to carry out the change in delay line 104 in accordance with output signal 122. This procedure is continued until a lock state is achieved.

Multiple phase detection, in accordance with the present invention, enables a fast DLL lock scheme with coarse and fine phase adjustments. The Ref_clock and FB_clock are input to multiple phase detectors to achieve a lock state in significantly fewer clock cycles. Illustrative examples follow to further demonstrate the advantages of the present invention.

Figure 4:
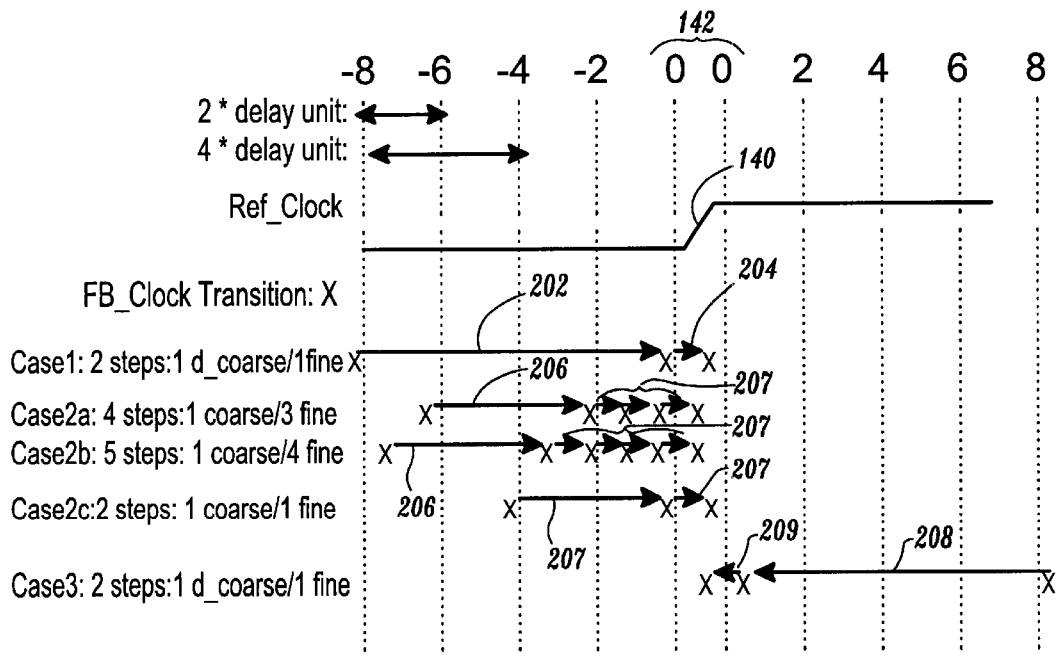
FIG. 4 is an illustrative timing diagram for cases 1, 2a–c and 3 where delay adjustments have been made to achieve a lock state in accordance with the present invention.

Referring to FIG. 4, an illustrative timing diagram is shown with different cases for clock synchronization. The Ref_clock signal 140 is centered in the >PD offset= (00) region 142 and the FB_clock transitions are depicted as X's in FIG. 4. FIG. 5 shows a table of outputs from PD units 107–111 of FIG. 3. FIGS. 4 and 5 will be referred to for describing cases 1, 2a–c and 3. FIG. 5 lists the output of phase detectors (PD) as a decoding table to the timing diagram shown in FIG. 4. A lock condition is achieved if the output of PD−2 +2 is 0. The state of the phase detector PD−2 +2 (+ or −) determines if the DL unit is incremented or decremented. The state of the other PD=s determine the step size (e.g., fine or coarse) of the adjustment.

In case 1, a FB_clock signal needs to be incremented to synchronize the FB_clock signal to the Ref_clock signal. PD units PD−8, PD−4, PD−2 +2, PD+4, and PD+8 (units 107–111, respectively of FIG. 3) initially output all '°'s (see case 1 of FIG. 5) indicating the need for an increment and an adjustment of 8. In this case, an increment of 8 units (coarse adjustment 202 of FIG. 4)) is available for adjusting the delay in the FB_clock signal in delay line 104 (FIG. 3). On the next clock cycle, a fine adjustment increment is needed and is indicated by "+'s in FIG. 5 (second line under case 1). Now, a fine adjustment signal is output from coarse/fine adjustment circuit 108 (FIG. 3) which causes control unit 124 to reduce the delay in delay line 104 further. A fine adjustment 204 (FIG. 4) is made. This centers the delay of FB_clock in the PD offset zone 142. In the next clock cycle (see line 3 of case 1 of FIG. 5), a lock state is achieved in PD−2 +2 (e.g., a zero is indicated).

In cases 2a–c, an available course adjustment includes four delay units. In FIG. 5, initial PD unit outputs provide 4 '+'s indicating a coarse adjustment 206 should be incremented (PD−2 +2 is +). In subsequent clock cycles, 3 '+'s are shown for the PD units (FIG. 5). This indicates the need for a fine adjustment 207 (FIG. 4). This assumes that a 2 delay unit increment is not available. Each subsequent cycle still indicates an increment is needed. Therefore, fine adjustments 207 are continued until a lock state ('0' for PD−2 +2) is achieved.

In case 3, a decrement is needed as initially indicated by 5 '−'s in FIG. 5 for case 3. The decrement includes a coarse adjustment 208 of 8 delay units. In a next step, a fine adjustment 209 is decrements to center the FB_clock in the PD offset region 142.

Dependent on the adjustment range of each PD and the decoding of the PD output signals in the coarse/fine control unit, the delay line is incremented or respectively decremented by n×delay units. Possible implementation include different adjustment ranges and synchronization steps. In one embodiment, for example, adjustments of 4delay unit, 2×delay unit, 1×delay unit may be includes. Other examples may include 16×delay unit, 8×delay unit and/or ½×delay unit or any other sized delay unit. Other decoding methods may be employed for PD units, for example, different numbers of PD units may be employed having different phase difference ranges.

Figure 1:
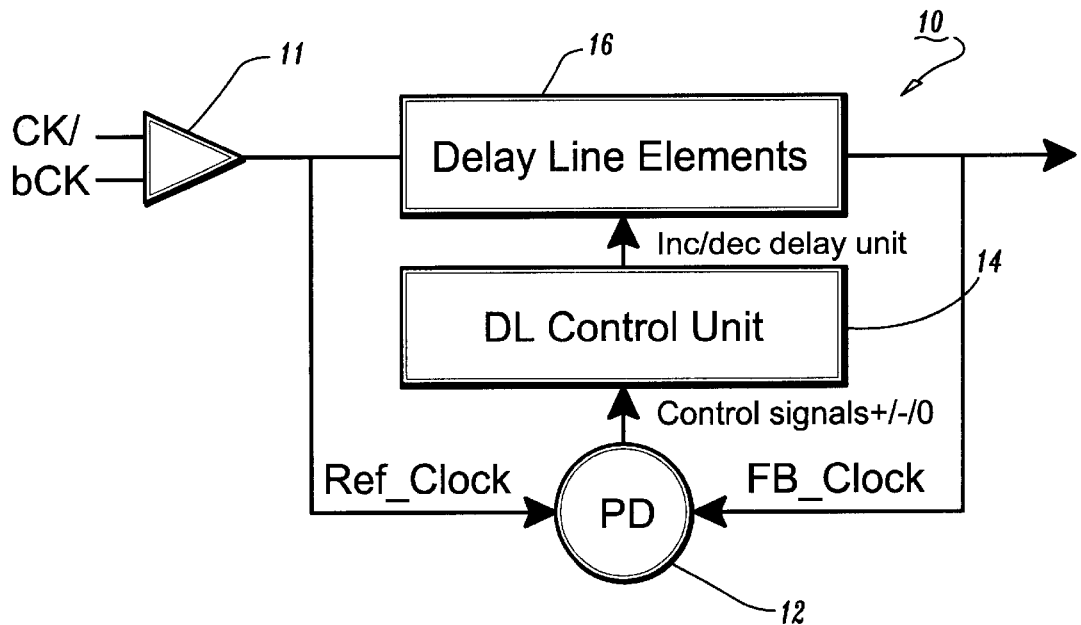
FIG. 1 is a schematic diagram showing a prior art delay locked loop having a single phase detector.
Figure 2:
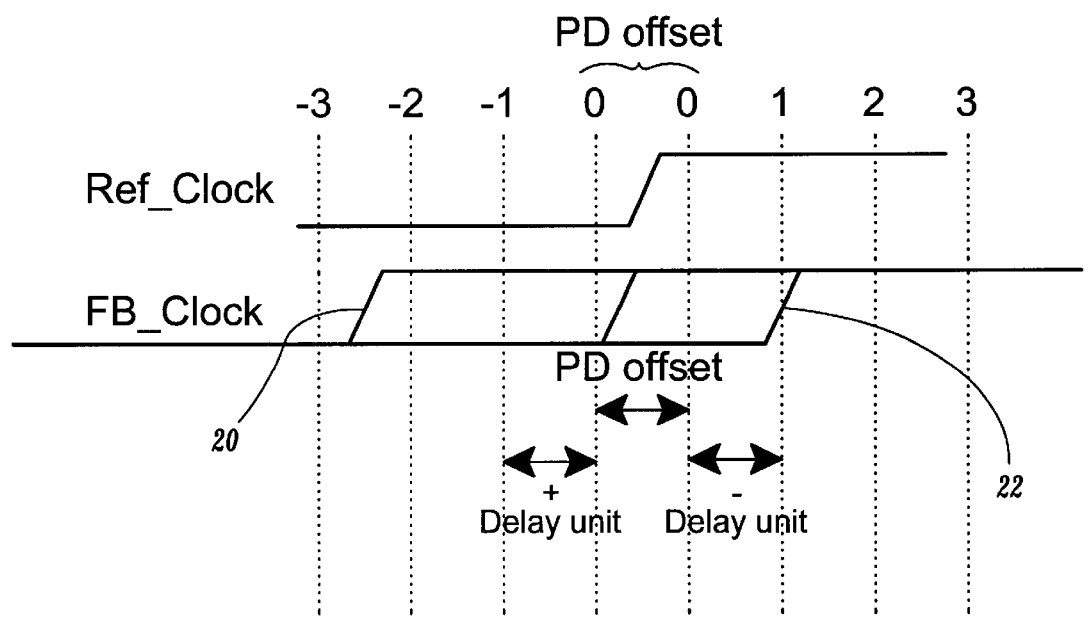
FIG. 2 is a timing diagram for the phase detector of FIG. 1, showing a limited adjustment range of the prior art.

The last column of FIG. 5 illustratively shows the minimum number of steps needed to achieve a lock state with the prior art scheme shown in FIG. 1. In case 1 of the present invention 2 steps are needed, while a minimum of 9 steps are needed for the prior art. In case 2a of the present invention, 4 steps are needed, while a minimum of 7 steps are needed for the prior art. In case 2b of the present invention, 5 steps are needed, while a minimum of 9 steps are needed for the prior art. In case 2c of the present invention, 2 steps are needed, while a minimum of 5 steps are needed for the prior art. In case 3 of the present invention, 2 steps are needed, while a minimum of 9 steps are needed for the prior art.

Referring to FIG. 6, a schematic diagram is illustratively shown for a PD−8 phase detector unit 300 in accordance with the present invention. Phase detector unit 300 may include a phase detector (PD) 302, for example a conventional phase detector. In this embodiment, REF_clock is connected to an input of phase detector 302. FB_clock is connected to a delay circuit 304. Delay circuit 304 includes a plurality of delay elements, such as inverters, RC circuits or the like, provided for delaying the FB_clock to provide an internal clock signal IFB.

Delay circuit 304 may include delay of an integral number (n) of delay units (DU), which may be electronically enabled (e.g., logically switched) or trimmable by fuses or during fabrication (e.g., metal trimmable). In this way, a same layout for delay circuit 304 may be employed to provide different PD's in accordance with the present invention, by selecting the appropriate number of delay elements in delay circuit 304. In this example, the appropriate number of delay elements is sufficient to provide a PD–8 detector. By adjusting the FB_clock signal and comparing phase differences using a PD 302, a determination of the difference between REF_clock and FB_clock can be made.

Referring to FIG. 7, a timing diagram is shown for the clock signals depicted in FIG. 6. REF_clock is centered in a PD offset region 308. By employing PD–8 an offset of FB_clock is incremented by +8 to achieve IFB as shown. When comparing IFB and REF_clock in PD 302, an increment is needed to center IFB+8 with Ref_clock. This condition returns a '+' to indicate an increment is needed. This is interpreted by coarse/fine adjustment circuit 108.

Referring to FIG. 8, a schematic diagram is illustratively shown for a PD+4 phase detector unit 400 in accordance with the present invention. Phase detector unit 400 may include a phase detector (PD) 402, for example a conventional phase detector. In this embodiment, REF_clock is connected to a delay circuit 404, and FB_clock is connected to an input of phase detector 402. Delay circuit 404 includes a plurality of delay elements, such as inverters, RC circuits or the like, provided for delaying the REF_clock to provide an internal clock signal IREF.

Delay circuit 404 may include delay of an integral number (n) of delay units (DU), which may be electronically enabled (e.g., logically switched) or trimmable by fuses or during fabrication (e.g., metal trimmable). In this way, a same layout for PD 402 and delay circuit 404 may be employed to provide different PD's in accordance with the present invention, by selecting the appropriate number of delay elements in delay circuit 404. In this example, the appropriate number of delay elements is sufficient to provide a PD+4 detector.

Referring to FIG. 9, a timing diagram is shown for the clock signals depicted in FIG. 8. Ref_clock is centered in a PD offset region 408. By employing PD+4, an offset of REF_clock is incremented by +4 to achieve IREF as shown. When comparing IREF+4 and REF_clock in PD 402, a decrement is needed to center IREF+4 with Ref_clock. This condition returns a '−' to indicate a decrement is needed for FB_clock. This is interpreted by coarse/fine adjustment circuit 108.

It is to be understood that the number of PD=s in the multiple phase detector scheme is not limited to the illustrative examples described above. The present invention may be employed with 2 or more PD's to achieve faster adjustment to achieve a lock state. Adjustment range and step size are flexible and may be adjusted for the application.

The present invention may be employed in any circuit, which employs DLL's. The present invention is particularly useful in integrated circuits and, more particularly in semiconductor memories. In new semiconductor memory specifications, for example DDR SDRAMs, DLL characterization is necessary to determine phase shift due to noise, temperature variation, etc. in a power down (DLL off) mode. DLL updates are needed with an auto refresh (AR).

The present invention provides a faster DLL lock after power up, or Self Refresh exit, for example. A DLL reset is performed by an extended mode register command. The DLL reset command is issued as part of the power on sequence or after self refresh exit.

The present invention also compensates for noise and temperature shift. Conventional DLL schemes compensate for phase difference by a fixed stepsize (e.g., inc. or dec.) with fixed delay units. Advantageously, the present invention provides clock accumulation, which means that a course delay element invoked for phase adjustment with 1 clock cycle is substituted for a number of fine delay elements which requires multiple clock cycles to achieve a same stepsize.

Having described preferred embodiments for improved DLL lock scheme with multiple phase detection (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A delay lock loop comprising:
a plurality of phase detectors each receiving a first clock signal and a second clock signal, the second clock signal including a delayed first clock signal;
each phase detector including a specified delay range for detecting phase differences between the first and second clock signals in that range; and
a delay line including an input and an output, the first clock signal being received at the input, wherein an amount of delay applied to the first clock signal is adjusted in the delay line in accordance with control signals of the phase detectors, the control signals of all of the phase detectors being combined to provide a single adjustment magnitude and direction for the delay line.

2. The delay lock loop as recited in claim 1, wherein the plurality of phase detectors includes five phase detectors.

3. The delay lock loop as recited in claim 1, wherein the specified ranges include multiples of a delay unit.

4. The delay lock loop as recited in claim 1, further comprising a control unit coupled to the phase detectors for receiving the control signals and generating a delay line control signal which enables or disables delay elements in the delay line to adjust delay in the second clock signal.

5. The delay lock loop as recited in claim 4, further comprising an adjustment control circuit coupled to the phase detectors and the control unit, the adjustment control circuit adapted to interpret the control signals from all of the phase detectors for the control unit to determine an adjustment size for a change in delay.

6. The delay lock loop as recited in claim 5, wherein the adjustment size includes at least two discrete sizes.

7. The delay lock loop as recited in claim 1, wherein the control signals include one of an increment state, a decrement state and a lock state.

8. The delay lock loop as recited in claim 1, wherein the control signals of one of the phase detectors is employed to determine when to increment, decrement or lock the delay of a second clock cycle.

9. The delay lock loop as recited in claim 1, wherein the phase detectors include delay elements adapted to generate an internal clock signal to compare with one of the first clock signal and the second clock signal to determine a phase difference between the internal clock signal and one of the first clock signal and the second clock signal.

10. The delay lock loop as recited in claim 1, wherein phase detector outputs the control signal in accordance with the phase difference between the internal clock signal and one of the first clock signal and the second clock signal.

11. A delay lock loop comprising:
a delay line including an input and an output, a first clock signal being received at the input and a second clock signal including a delayed first clock signal at the output;

at least two phase detectors, each receiving the first clock signal and the second clock signal, the phase detectors for determining a phase difference between the first clock signal and the second clock signal in a specified phase difference range and outputting a control signal in accordance with the phase difference; and an adjustment circuit coupled to outputs of the phase detectors for interpreting the control signals from all of the phase detectors, the adjustment circuit adapted to determine whether to increment, decrement or lock the delay line and to determine a size of the increment or decrement to reduce the phase difference between the first and second clock signals by combining the control signals of the phase detectors to provide a single adjustment magnitude and direction for the delay line.

12. The delay lock loop as recited in claim 11, wherein the at least two phase detectors includes five phase detectors.

13. The delay lock loop as recited in claim 11, wherein the specified phase difference ranges include multiples of a delay unit.

14. The delay lock loop as recited in claim 11, wherein the adjustment circuit provide a delay line control signal which enables or disables delay elements in the delay line to adjust delay in the second clock signal.

15. The delay lock loop as recited in claim 14, wherein the adjustment circuit includes an adjustment control circuit coupled to the phase detectors, the adjustment control circuit adapted to interpret the control signals from the phase detectors for the adjustment control unit to determine an adjustment size for a change in delay.

16. The delay lock loop as recited in claim 15, wherein the adjustment size includes at least two discrete sizes.

17. The delay lock loop as recited in claim 11, wherein the control signals include one of an increment state, a decrement state and a lock state.

18. The delay lock loop as recited in claim 11, wherein the control signals of one of the phase detectors is employed to determine when to increment, decrement or lock the delay of a second clock cycle.

19. The delay lock loop as recited in claim 11, wherein the phase detectors include delay elements adapted to generate an internal clock signal to compare with one of the first clock signal and the second clock signal to determine a phase difference between the internal clock signal and one of the first clock signal and the second clock signal.

20. The delay lock loop as recited in claim 11, wherein phase detector outputs the control signal in accordance with the phase difference between the internal clock signal and one of the first clock signal and the second clock signal.

21. A method for adjusting delay in a delay lock loop, comprising the steps of:

providing a delay lock loop including a plurality of phase detectors each receiving a first clock signal and a second clock signal, each phase detector including a specified delay range for detecting phase differences between the first and second clock signals in that range, and a delay line including an input and an output, the first clock signal is received at the input and the second clock signal includes a delayed first clock signal;

determining phase differences for each phase detector;

outputting control signals from the phase detectors;

determining whether to increment, decrement or lock the delay lock loop by combining the control signals of the phase detectors;

if an increment or decrement is determined, determining an amount of delay to be incremented or decremented by employing the control signals of all the phase detectors; and adjusting the delay line in accordance with the control signals.

22. The method as recited in claim 21, further comprising the step of repeating the steps until a lock state is achieved.

23. The method as recited in claim 21, wherein the specified phase difference ranges include multiples of a delay unit.

24. The method as recited in claim 21, wherein the amount of delay to be incremented or decremented may be adjusted by at least two discrete sizes.

25. The method as recited in claim 21, wherein the control signals include one of an increment state, a decrement state and a lock state.

26. The method as recited in claim 21, wherein the control signals of one of the phase detectors is employed to determine when to increment, decrement or lock the delay of a second clock cycle.

27. The method as recited in claim 21, further comprising the step of adjusting the delay of a second clock cycle by a plurality of delay units in a single clock cycle.

28. A delay lock loop comprising:

a plurality of phase detectors each receiving a first clock signal and a second clock signal, the second clock signal including a delayed first clock signal;

each phase detector including a specified delay range for detecting phase differences between the first and second clock signals in that range; and a delay line including an input and an output, the first clock signal being received at the input, wherein an amount of delay applied to the first clock signal is adjusted in the delay line in accordance with control signals of the phase detectors, wherein the plurality of phase detectors includes five phase detectors.

29. A delay lock loop comprising:

a plurality of phase detectors each receiving a first clock signal and a second clock signal, the second clock signal including a delayed first clock signal;

each phase detector including a specified delay range for detecting phase differences between the first and second clock signals in that range; and a delay line including an input and an output, the first clock signal being received at the input, wherein an amount of delay applied to the first clock signal is adjusted in the delay line in accordance with control signals of the phase detectors, wherein the plurality of phase detectors includes at least three phase detectors.

* * * * *